(12) United States Patent
Kilthau et al.

(10) Patent No.: US 7,897,893 B2
(45) Date of Patent: Mar. 1, 2011

(54) METHOD FOR DRILLING HOLES IN A SUBSTRATE, IN PARTICULAR AN ELECTRICAL CIRCUIT SUBSTRATE, BY MEANS OF A LASER BEAM

(75) Inventors: Alexander Kilthau, Bad Schönborn (DE); Hans Jürgen Mayer, Viernheim (DE); Marc Van Biesen, Wieze (BE)

(73) Assignee: Hitachi Via Mechanics, Ltd., Ebina-shi (JP)

( * ) Notice: Subject to any disclaimer, the term of this patent is extended or adjusted under 35 U.S.C. 154(b) by 797 days.

(21) Appl. No.: 11/117,414

(22) Filed: Apr. 29, 2005

(65) Prior Publication Data
US 2007/0187373 A1   Aug. 16, 2007

Related U.S. Application Data

(63) Continuation of application No. PCT/DE03/03564, filed on Oct. 27, 2003.

(30) Foreign Application Priority Data

May 11, 2002   (DE) ................. 102 51 480

(51) Int. Cl.
*B23K 26/06* (2006.01)
(52) U.S. Cl. ............... 219/121.67; 219/121.69; 219/121.79
(58) Field of Classification Search ............ 219/121.62, 219/121.78, 121.7, 121.72, 121.79
See application file for complete search history.

(56) References Cited

U.S. PATENT DOCUMENTS 3,742,182 A    6/1973  Saunders
4,169,976 A *  10/1979 Cirri ................ 219/121.72
4,782,438 A *  11/1988 Mizukado et al. ......... 700/86
5,593,606 A     1/1997 Owen et al.
5,632,913 A     5/1997 Mori
5,688,418 A *  11/1997 Yoshiyasu et al. ...... 219/121.71
5,856,649 A     1/1999 Yamazaki et al.
5,910,261 A *   6/1999 Mori et al. ............ 219/121.71
5,973,290 A *  10/1999 Noddin ................ 219/121.7
2001/0045419 A1 11/2001 Dunsky et al.

FOREIGN PATENT DOCUMENTS

EP   0795375 A1   9/1997
JP   02169194 A   6/1990
JP   07232288     9/1995

OTHER PUBLICATIONS

"Trepanning Moves in on mini holes", Machinery and production engineering, Machinery publishing Co. Ltd., Burgess Hill, GB, Nov. 1983, Seiten 42,43,XP0019471, ISSN: 0024-919X, Seite 42, Abs. 7-Seite 43, Absatz 3.

* cited by examiner

*Primary Examiner*—Tu B Hoang
*Assistant Examiner*—Brian Jennison
(74) *Attorney, Agent, or Firm*—Crowell & Moring LLP

(57) ABSTRACT

Disclosed is a valve having a housing with a valve seat for a two-piece flap which is rotatably mounted on a drive shaft. An annular piston seal and an adjacent cover disk are disposed between the first part and the second part of the two-piece flap so as to revolve therearound. The diameter of the cover disk is smaller than the diameter of the annular piston seal which is embodied as a metal ring that is provided with a gap. The invention also relates to the use of the valve as a gas recirculation valve.

4 Claims, 4 Drawing Sheets

METHOD FOR DRILLING HOLES IN A SUBSTRATE, IN PARTICULAR AN ELECTRICAL CIRCUIT SUBSTRATE, BY MEANS OF A LASER BEAM

BACKGROUND OF THE INVENTION

The invention relates to a method for laser drilling holes in a substrate, in particular an electrical circuit substrate, the laser beam with a spot diameter smaller than the hole diameter to be drilled being moved along at least one circular path in the region of the hole to be drilled in each case.

U.S. Pat. No. 5,593,606 discloses a method of this kind whereby holes with a diameter larger than the beam diameter of the laser are produced by moving the laser beam outward or inward either along spiral paths or in concentric circles within the hole region.

For the drilling of circuit boards or comparable circuit substrates, after optimization the particular deflector unit used is moved to one hole position after another, the shape and processing or machining of the hole being expediently predefined by a program (a so-called drilling tool). Using this program each hole is machined in an identical manner. In a suitable procedure, for particularly precise and rapid drilling the laser beam is programmed to jump from an initial position, e.g. a previously drilled hole, to the center of the new hole to be drilled and is traversed from there to the first circular path in an always identical, defined angular direction. After completing this first circular path, the beam can then, if necessary, be traversed to other circular paths. If the traversing direction from the hole center to the first circular path is now fixed at a predefined angle, whereas the previous jump direction from different starting points (drilled holes) assumes quite different angles in each case, this means that for the majority of all holes a change of direction of up to 180° is necessary between the jump to the hole center and the traversing movement to the circular path. The larger this change of direction between the jump direction and the traversing direction, the greater the necessary abrupt change in position of the deflector unit also, i.e. in general the galvo mirrors. An angular change of direction always means a time loss due to the necessary recovery time of the mirrors after the movement as well as a stress factor for the galvo motors because higher peak currents are flowing; this has a negative effect on their service life. If a mirror recovery time is dispensed with, this adversely affects hole quality, i.e. noncircular holes are obtained. In addition, particularly in the case of a 180° reversal in the direction of travel, it is first necessary to stop, and then re-accelerate, which means that a new galvo motor lag error is introduced.

SUMMARY OF THE INVENTION

The object of the present invention is to improve the above-mentioned method for drilling holes in substrates in such a way that a higher process speed is achieved while maintaining good hole quality, i.e. good hole circularity. At the same time the deflector units should be less stressed, i.e. so that galvo motors in particular achieve a longer service life.

This object is achieved according to the invention as follows: each time the laser beam is aligned to a new hole, the beam axis is first directed to the center of the hole to be drilled in a jump direction predefined by the beam position and then directed away from the center in a defined radial traversing movement onto a defined circular path, the angular direction of the traversing movement being defined as a function of the jump direction in such a way that a change in direction of the beam axis at the center does not exceed a predefined maximum angular range or that—ideally—the direction is maintained.

With the method according to the invention, the movement away from the hole center is therefore selected as a function of the jump direction from the last hole in each case in such a way that abrupt changes of direction, e.g. of more than 225°, are avoided.

In a first embodiment of the method according to the invention, this can be achieved by varying the predefined drilling program for a hole in each individual case so that the angular direction of the traversing movement is matched to the jump direction of the incoming laser beam. Although in this case there is now no or virtually no change in direction at the hole center, a solution of this kind is very costly.

For the majority of applications, an advantageous embodiment of the method according to the invention is therefore one in which a number of angular directions, each assigned an angular range for incoming jump directions, are predefined for the traversing movement according to the predefined maximum angular range, an associated drilling program with the associated traversing direction being selectable depending on the angular range in which the jump direction lies. If, for example, the maximum permissible angular range for a change of direction at the center is 45°, eight angular ranges of 45° to which an outgoing traversing direction with associated drilling program is assigned in each case are specified for the incoming jump directions. The associated drilling program is then selected and implemented depending on the jump direction of the incoming laser beam.

BRIEF DESCRIPTION OF THE SEVERAL VIEWS OF THE DRAWINGS

The invention will now be explained in greater detail with reference to examples and the accompanying drawings in which.

DETAILED DESCRIPTION OF THE INVENTION

Figure 1:
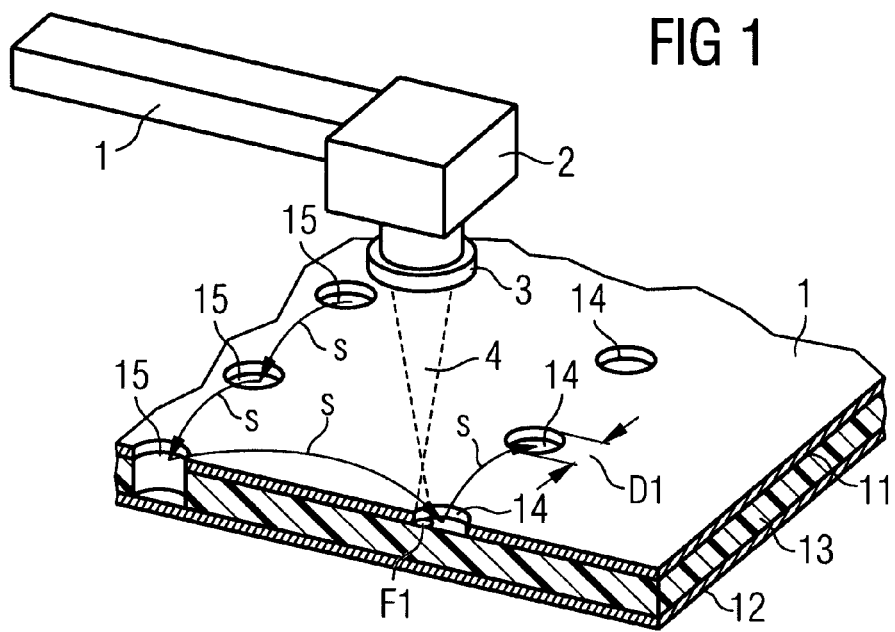
FIG. 1 schematically illustrates a laser arrangement for drilling holes in a multilayer substrate.

The arrangement shown schematically and not drawn to scale in FIG. 1 shows a laser 1 with a deflector unit 2 and an optical imaging unit 3 via which a laser beam 4 is directed onto a substrate 10, preferably a circuit board. In the example shown, this substrate 10 has an upper first metal layer (e.g. a copper layer) 11 and a lower second metal layer 12 between which a dielectric layer 13 is disposed. This dielectric layer consists, for example, of a polymer material such as RCC or a woven glass reinforced polymer material such as FR4. It is well known that the metal layers which generally consist of copper require a different amount of energy for processing or transmission than the dielectric. Accordingly, different laser settings as well as different pulse repetition rates and different focusings of the laser beam can also be selected.

As shown in FIG. 1, blind or through via-holes 15 with a diameter D1 are to be drilled into the substrate 1. For this purpose, holes 14 can be drilled through the copper layer 11, for example, with a first setting of the laser and then the blind vias 15 can be made in the dielectric layer 13 using another laser setting. Irrespective of which material is being drilled, it will be assumed here that the laser beam 4 is moved with its focal point F1 in concentric circles in the hole region to be drilled until the material has been completely removed from the relevant hole 14 or 15. The individual holes are processed one after the other, so that the laser beam or the optical axis of the laser beam which has been deactivated or operated with very low energy during the jump (at 355 nm UV e.g. in CW mode) jumps from one hole region to the next.

Figure 2:
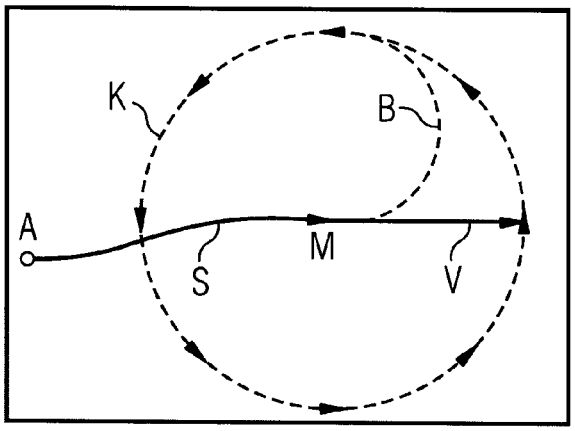
FIG. 2 shows the path of the beam axis of an incoming laser beam in the region of a hole to be drilled, without angular change at the center.

In FIG. 1 this jump direction from one hole to the other is indicated by an arrow S in each case. The jump therefore proceeds from a starting point at a previous hole, e.g. after completion of a drilling operation at a peripheral point or hole center, in an approximately straight line to the center of the subsequent hole to be drilled. From this center M a predefined drilling program is initiated, the axis of the laser beam being first directed onto a circular path in a fixed traversing direction V or alternatively starting from the center of the circle. When the circular path is reached, the laser is activated and the laser beam travels around the circular path in one or more passes depending on the particular requirements, such as substrate material, hole depth, type and energy density of the laser. If the size of the hole requires a plurality of concentric passes of the laser, after traveling around the first circular path one or more times the laser beam is traversed to another circular path. In practice the laser beam or the beam axis of the deactivated laser is moved from the center M in the traversing direction V only initially, after which it is expediently controlled in such a way that it is brought progressively closer to the desired circular path K, describing an arc B (FIG. 2).

As mentioned, the angle of the jump direction S to the center M depends on the relevant starting point A, which is generally a previously drilled hole. Depending on the arrangement and sequence of the holes to be processed, the jump direction S can therefore assume any angle. However, as the angle of the traversing direction V is pre-programmed in a fixed manner, a more or less large change of angle occurs at the center M. The ideal case is shown in FIG. 2, in which the starting point A is located such that the jump direction S is approximately the same as the traversing direction V which is assumed to 0° in the X-axis. The axis of the laser beam can therefore be moved further away from the center M without discontinuity, so that the deflector unit can execute a continuous movement. The laser beam is therefore moved in the traversing direction V toward the circular path, then brought into the circular path K following the dashed arc B or alternatively in the traversing direction V and performs the drilling operation along the dashed circular path K.

Figure 3:
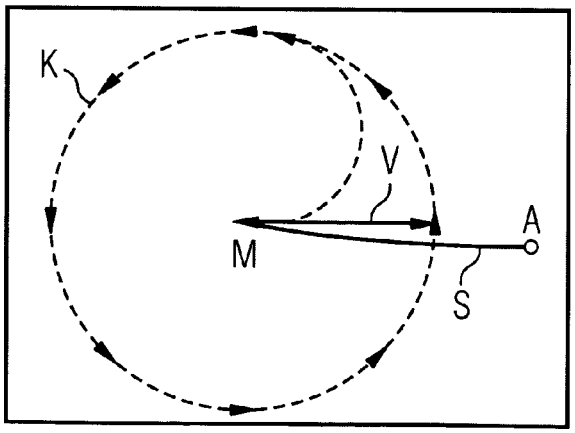
FIG. 3 shows the path of the incoming laser beam in the region of a hole to be drilled, with maximum angular change at the center.
Figure 4:
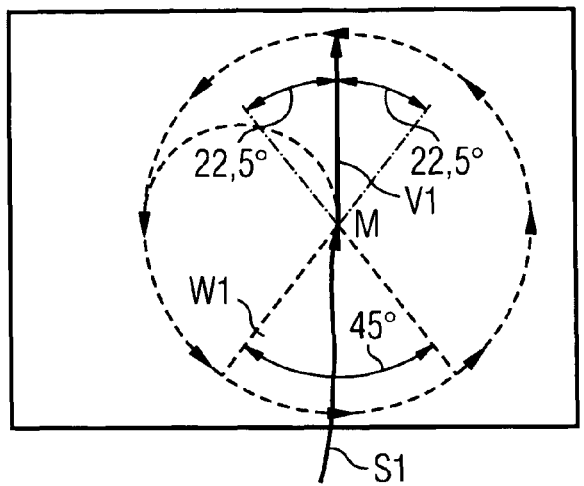
FIGS. 4 to 11 show the path of the axis of a laser beam in the region of a hole to be drilled using the method according to the invention for different jump directions of the incoming beam.
Figure 5:
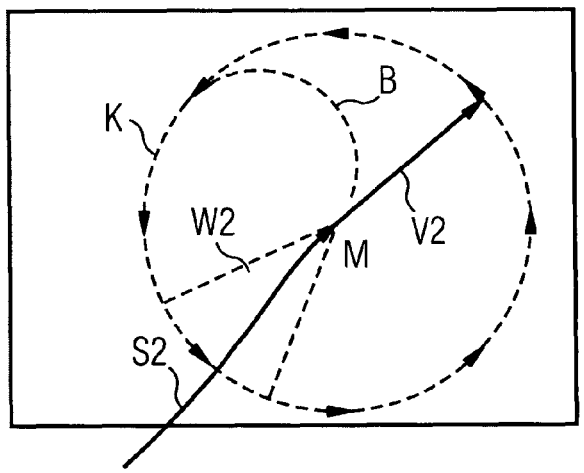
Figure 6:
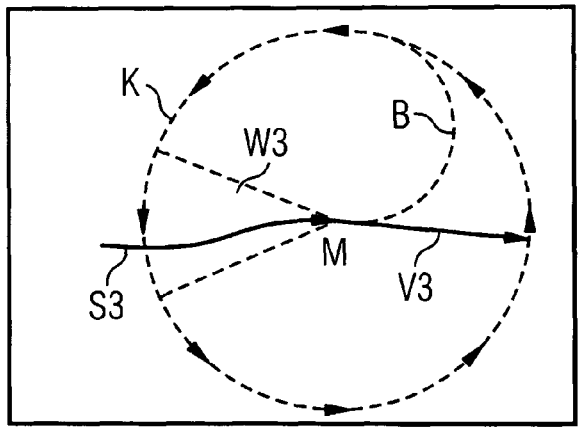
Figure 7:
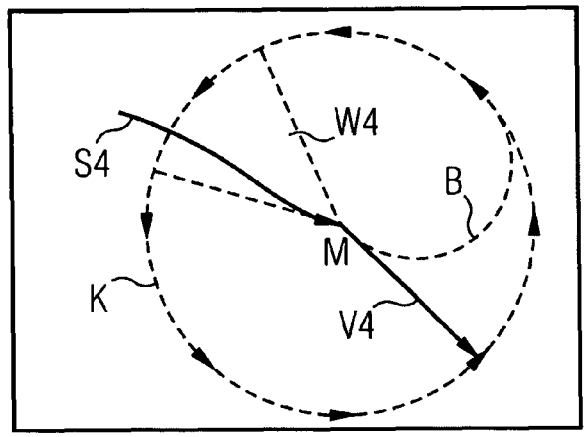
Figure 8:
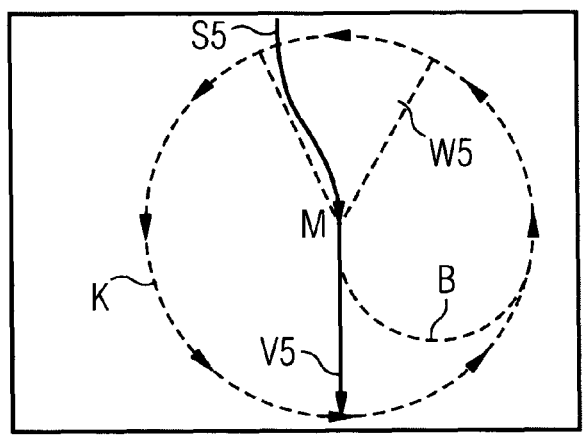
Figure 9:
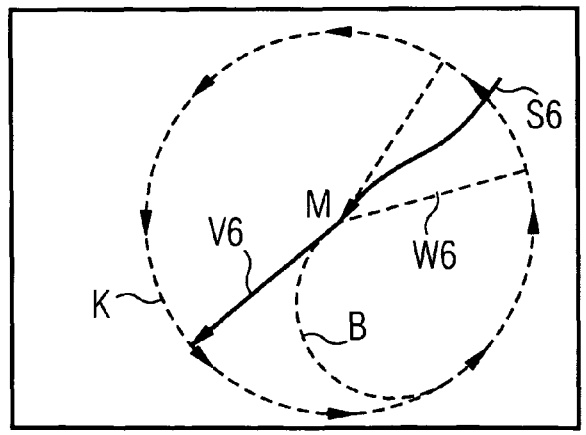
Figure 10:
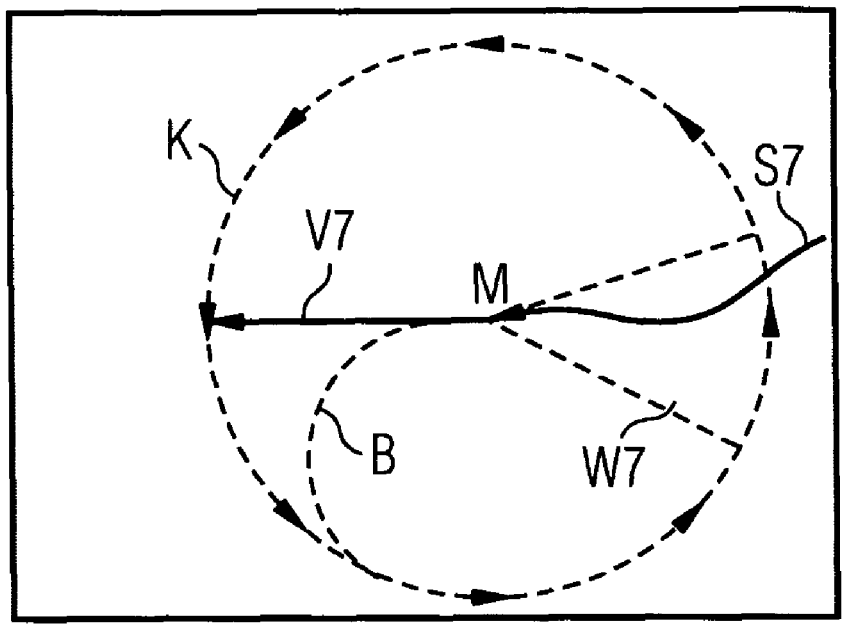
Figure 11:
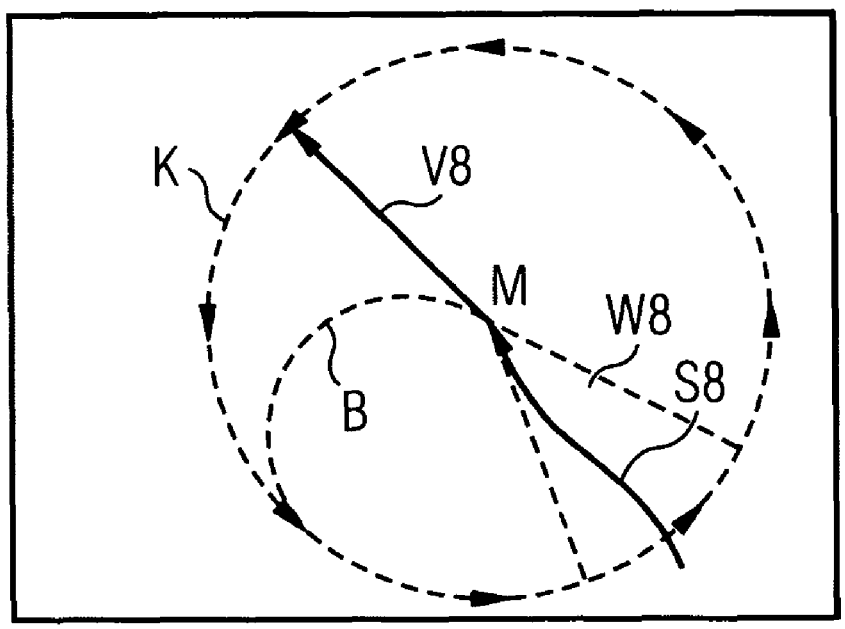

The worst-case scenario for guiding the laser beam is shown in FIG. 3. In this case the axis of the laser beam arrives in a jump direction which is at an angle of 180° to the predefined traversing direction V. The beam axis therefore has to accomplish a 180° direction reversal at the center M. To achieve this, the deflector unit first has to be stopped and then accelerated in the new direction.

In order to avoid such delays caused by large changes in direction at the center of the hole to be drilled, the traversing direction is matched as closely as possible to the jump direction S in terms of angle in accordance with the invention. As any adaptation of the drilling program in order to achieve the ideal case (in accordance with FIG. 2) for each direction is very complex/costly, a certain number of drilling programs is rigidly predefined, and, depending on the jump direction, the program having the smallest deviation between jump direction and traversing direction is selected in each case. In the example described here, eight programs having traversing directions V1 to V8 each offset by 45° are predefined, each traversing direction being assigned an angular range for an incoming jump direction. These eight predefined combinations of jump direction and traversing direction are shown in FIGS. 4 to 11. The eight pre-programmed traversing directions V1 to V8 are each linked to an angular range W1 to W8 so that, depending on the angular range W1 to W8 in which a jump direction S1 to S8 falls, the associated drilling program is automatically initiated with traversing direction S1 to S8, resulting in a maximum angular change at the center of 22.5° between jump direction and traversing direction. The direction from the hole center is given by the bisector of the opposite incident angular range in each case. If this angular range is 45°, the maximum angular change per range is max. 22.5° (see FIG. 4).

As the positions and machining sequence of the holes to the drilled on the substrate or circuit board are generally known, the relevant drilling program can be defined in advance for each hole to be the drilled so that no time losses due to any lack of processor power can occur. Moreover, the number of specified traversing directions is in no way limited to the example described, but any other number of predefined traversing directions and associated drilling programs can be provided depending on requirements or, ideally, the direction can be taken into account online.

The invention claimed is:

1. A method for laser drilling holes in a substrate, comprising:
    providing a laser beam having a beam spot diameter which is smaller than a diameter of a hole to be drilled;
    aligning the laser beam to a new hole;
    directing a beam axis in a jump direction predefined by a starting position to a center of the hole to be drilled; and
    directing the beam axis, with continuous movement, in a defined radial traversing movement away from the center and onto a defined circular path, wherein
    an angular direction of the traversing movement is defined as a function of the jump direction such that any change in direction of the beam axis at the center is less than or equal to a predefined maximum angle or else the direction is maintained, and wherein
    a number of fixed angular directions for the traversing movement is specified according to the predefined maximum angular range and wherein one of these angular directions is selected depending on the jump direction, and wherein
    the maximum angular range being 360°/2n, where n is an integer greater than 2, and wherein
    the laser is activated when the circular path is reached.

2. The method according to claim 1,
    wherein eight angular ranges of 45° each are predefined and eight thereto corresponding angular directions for the traversing movement are predefined using an appropriate drilling program.

3. The method according to claim 1,
    wherein a number and sequence of holes to be drilled on a substrate are pre-programmed and wherein a drilling program with corresponding traversing direction predefined for each hole according to the jump directions occurring.

4. The method according to claim 1, wherein the fixing angular directions are so linked that the predefined maximum angular change at the center is 22.5° between the jump direction and the selected angular direction.

* * * * *